United States Patent [19]

Willard

[11] Patent Number: 5,478,399
[45] Date of Patent: Dec. 26, 1995

[54] UNITARY WAFER PLASMA ENHANCED CHEMICAL VAPOR DEPOSITION HOLDING DEVICE

[75] Inventor: Calvin K. Willard, Boise, Id.

[73] Assignee: Micron Technology, Inc., Boise, Id.

[21] Appl. No.: 161,720

[22] Filed: Dec. 3, 1993

[51] Int. Cl.⁶ .................................................. C23C 16/00
[52] U.S. Cl. ....................... 118/728; 118/723 E; 118/725
[58] Field of Search ........................ 118/723 E, 723 ER, 118/724, 728, 725; 156/345

Primary Examiner—R. Bruce Breneman
Assistant Examiner—Jonathan D. Baskin

[57] ABSTRACT

There is a unitary wafer plasma enhanced chemical vapor deposition (PECVD) holding device. Particularly, there is a unitary device used for holding and rotating wafers during deposition of materials. Uniquely, single wafer holder arms 31 can be mounted and removed from the unitary device. Additionally, each wafer holding arm can individually calibrate the alignment between the parallel pair of arms and calibrate the wafer positioning to the heater. For example, using a simple screw to bias the positioning of the arms.

20 Claims, 4 Drawing Sheets

UNITARY WAFER PLASMA ENHANCED CHEMICAL VAPOR DEPOSITION HOLDING DEVICE

FIELD OF THE INVENTION

The present invention relates to integrated circuits (ICs). Particularly, there is a unitary device used for holding and rotating wafers during deposition of materials. Uniquely, single wafer holder arms can be engaged and disengaged from the unitary device.

BACKGROUND OF THE INVENTION

The term epitaxial is derived from Greek, meaning to build upon. Epitaxial deposition, in general, is a deposition of a layer of single-crystal silicon on a single-crystal wafer. The deposited layer is a crystallographic extension of the substrate in terms of "seed" that is necessary to promote the single-crystal deposition.

Epitaxial deposition is a chemical vapor deposition (CVD) process. The original use of CVD started with the deposition of a single-crystal silicon in the late 1950's and has played a major role in the industry since.

Epitaxy (or epi) has played a major role in the evolution of bipolar transistors and bipolar integrated circuits. In recent years both MOS discrete transistors and ICs have started to use epi as a key part of their structures.

Silicon CVD processes can be categorized by temperature range, pressure, and reactor wall temperature. There are two types of Silicon CVE processes. Namely, Epitaxy, which follows substrate crystal orientation, and Polysilicon, having no crystal orientation on amorphous layers. The present invention involves the use of the latter with plasma enhanced chemical vapor deposition devices, or PECVD. Although other CVD processes can easily be adapted to use the disclosed embodiment.

Thin-film polysilicon deposition has many important applications in the semiconductor industry. Polysilicon was the key ingredient leading to the self-aligned MOS technology. Heavily-doped polysilicon has become the most widely used gate-electrode material for MOS products, both discrete and ICs. In addition, it serves as an interconnect, capacitor plate, doping source, and can be oxidized to form a stable layer of $SiO_2$. Polysilicon is utilized in these roles because of its compatibility with subsequent high-temperature processing, its excellent interface with $SiO_2$, its high reliability as a gate electrode material, and its ability to be deposited over steep topography with good conformal coverage. Lightly-doped polysilicon films are used as resistors in static memory products and to fill trenches in DRAMS. Thin films of polysilicon are made upon of small single-crystal grains of about 1000 angstrom separated by grain boundaries. The film that will be a polysilicon layer con be either amorphous or polycrystalline as deposited. Subsequent heat cycles at elevated temperatures will cause an amorphous film to become polycrystalline. This as deposited undoped film has an extremely high resistivity.

Over the years several types of CVD processes have evolved. Plasma-Enhance CVD (PECVD) reactors emerged in the late '80's and early '90's. PECVD systems can be operated at lower temperatures making item attractive for submicron technology.

One such PECVD machine is broadly illustrated in FIG. 1, with the following elements: PECVD 10 has chamber walls 12, door 14, wafers 16, heater 20, plasma gas applicators 18, PECVD chamber 22, bottom 24 and upper 30 plates for wedging the wafer holding arms 26, and locking screws 28 that hold the plates together.

FIGS. 2 and 3 illustrate an isolated view of top views of the upper plate 30 and lower plate 24 having the following elements: a pair of parallel wafer arm chambers 32, wafer arm holder spring lock chambers 30, wafer holding arms (represented by the single pair) 31 would be wedged between plates 30 and 24 in the chambers 32, where a spring (not shown in its chamber 30) would wedge the two arms in their chambers 32. It is noted that there are eight pairs of arms 31. Seven are deposition stations, and the last is for wafer loading and unloading. The device of FIGS. 1–3 can be purchased from Novellus, at 81 Vista Montana, San Hose, Calif. 95134; model no. 02-00163-00, described as Assay, fork ceramic, other related numbers are identified for parts of a complete PECVD.

PROBLEMS

There are problems with the existing design of the wafer arm holder plate designs. Specifically, a PECVD periodically needs to be cleaned. This entails removing the two plates and wafer holding arms from the device. Uniquely, there is a high probability of breaking the arms 31 during the cleaning process, or during the use of the device before cleaning, the arms become unleveled for several reasons like misalignment from wear or even drooping from the repetitive heating of the PECVD, and therefore need replacement.

This is where the difficulty multiplies. The two plates have to be separated. As a result, often all the arms 31 will droop down or fall out and loosen or detach the attached holding springs. The arm(s) now needed to be replaced, often requiring much frustration to balance the arms and mount the springs. To compound the problems, the replacement of the top plate will cause even more jostling and additional misalignment of the arms and springs.

Therefore, there is tendency for maintenance workers to not want to replace the arms or to attempt to open the plates. Thus, there is an increased chance of breaking the arms while working on the remainder of the PECVD device. Compounding the problem of having to replace the expensive arms, which can run one to three hundred dollars each.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the unitary wafer plasma enhanced chemical vapor deposition holding device. Particularly, there is a unitary device used for holding and rotating wafers during deposition of materials. Uniquely, single wafer holder arms 31 can be mounted and removed from the unitary device. Additionally, each wafer holding arm can individually calibrate the alignment between the parallel pair of arms and calibrate the wafer positioning to the heater. For example, using a simple screw to bias the positioning of the arms.

Other features and advantages of the present invention may become more clear from the following detailed description of the invention, taken in conjunction with the accompanying drawings and claims, or may be learned by the practice of the invention.

Figure 1:
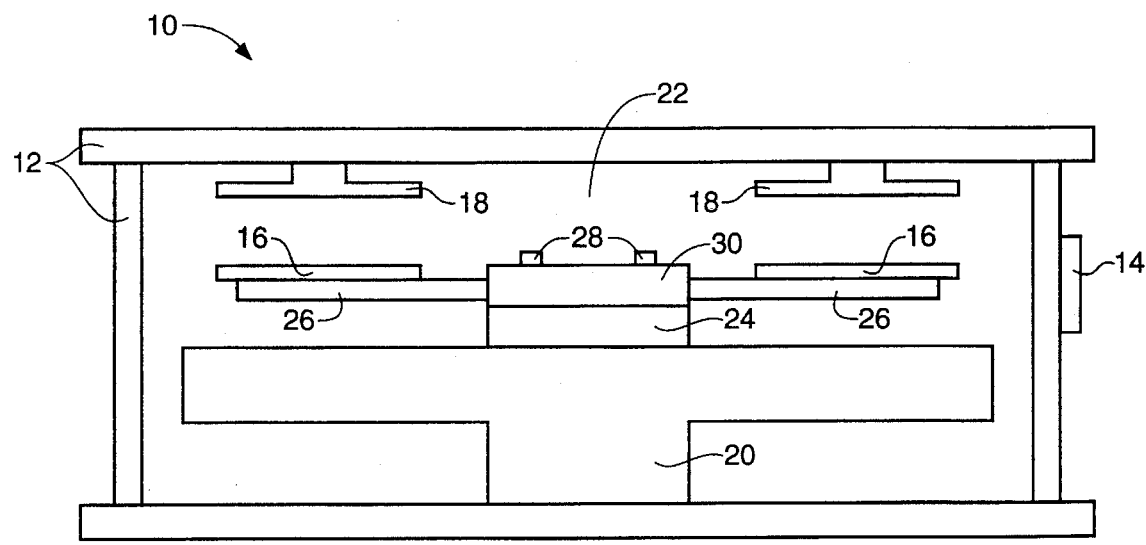
FIG. 1 is a related art side sectional view of a rough design of a PECVD device.
Figure 2:
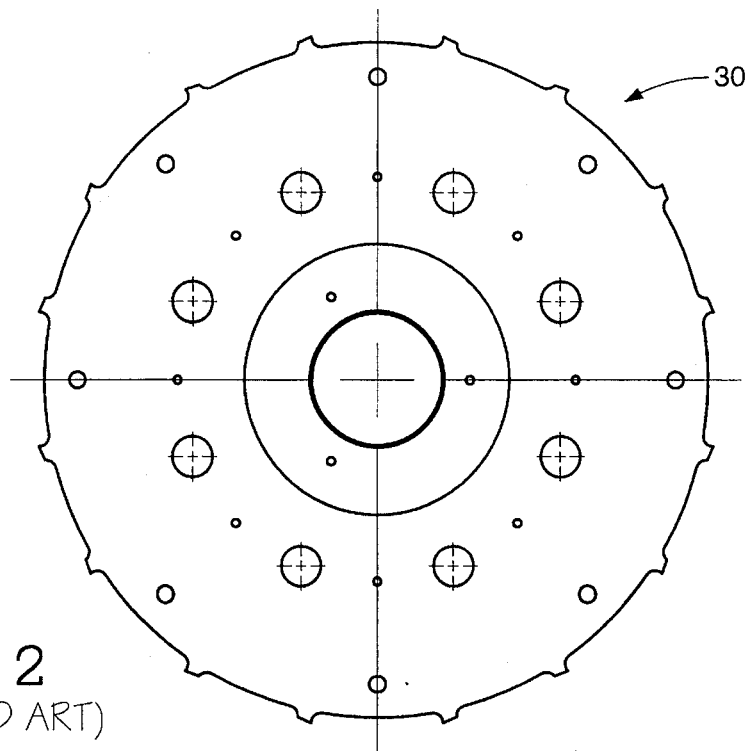
FIG. 2 is a related art top view a top plate as illustrated by the PECVD device.
Figure 3:
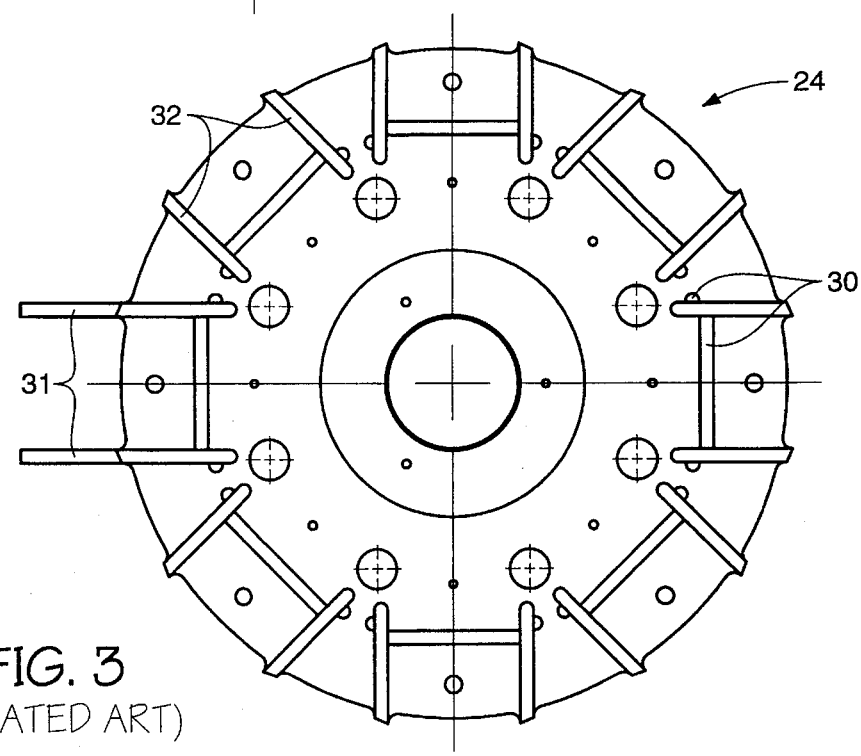
FIG. 3 is a related art top view of a bottom plate having the arm and spring cavities as utilized by a PECVD device.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

GENERAL EMBODIMENT

Figure 4:
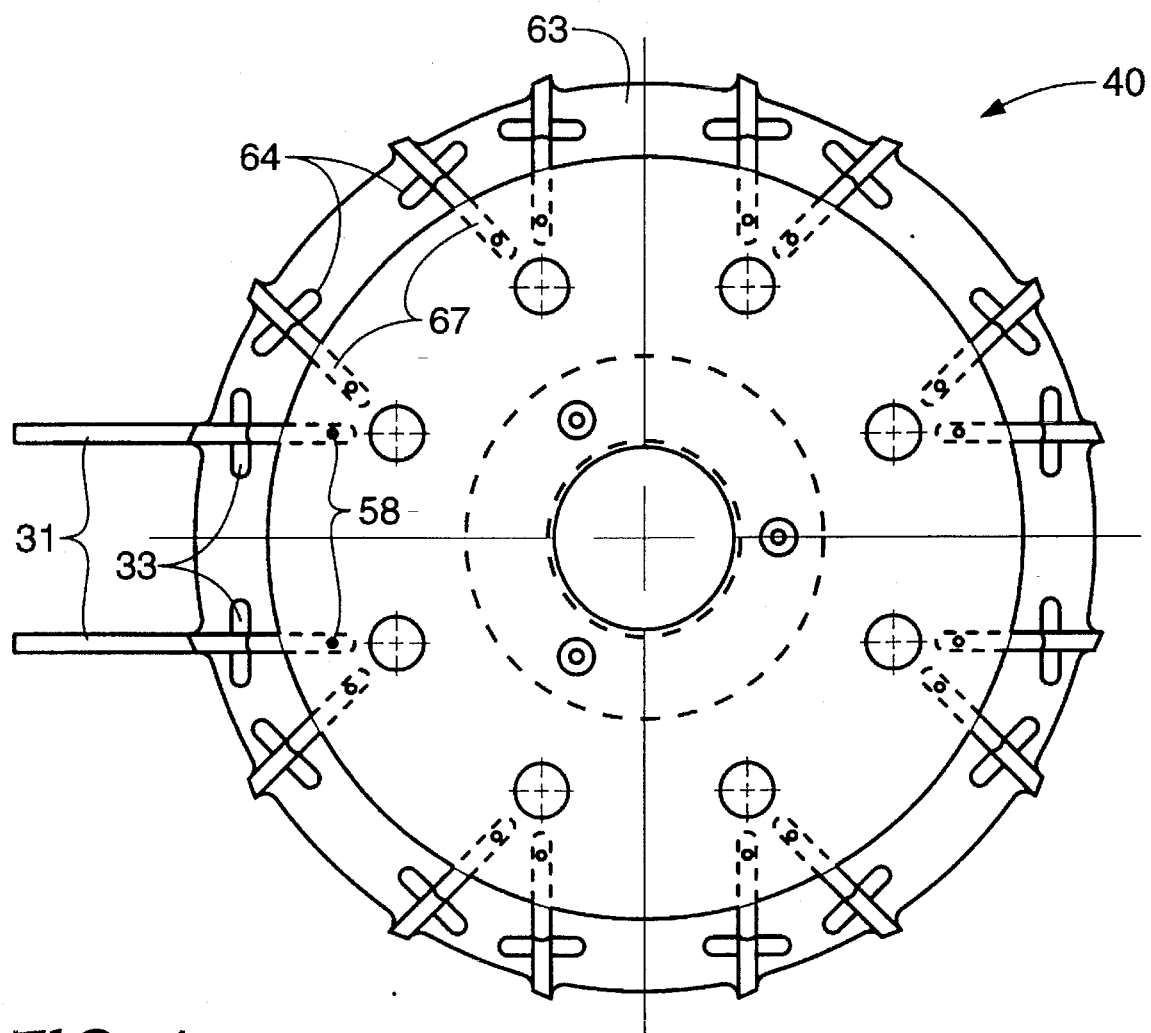
FIG. 4 is a detailed sectional illustration of a top view of the slot boards for connection to the zone boards.

FIG. 4, is a top view of the present invention having the following elements: A unitary wafer arm holder plate 40, a single representative pair of parallel wafer arms 31 and attached pivot arms 33, adjustment screws 58, wafer arm cavity 65, pivot arm cavity 64, raised surface 63, and wafer arm counter sink cavity 67.

Figure 5:
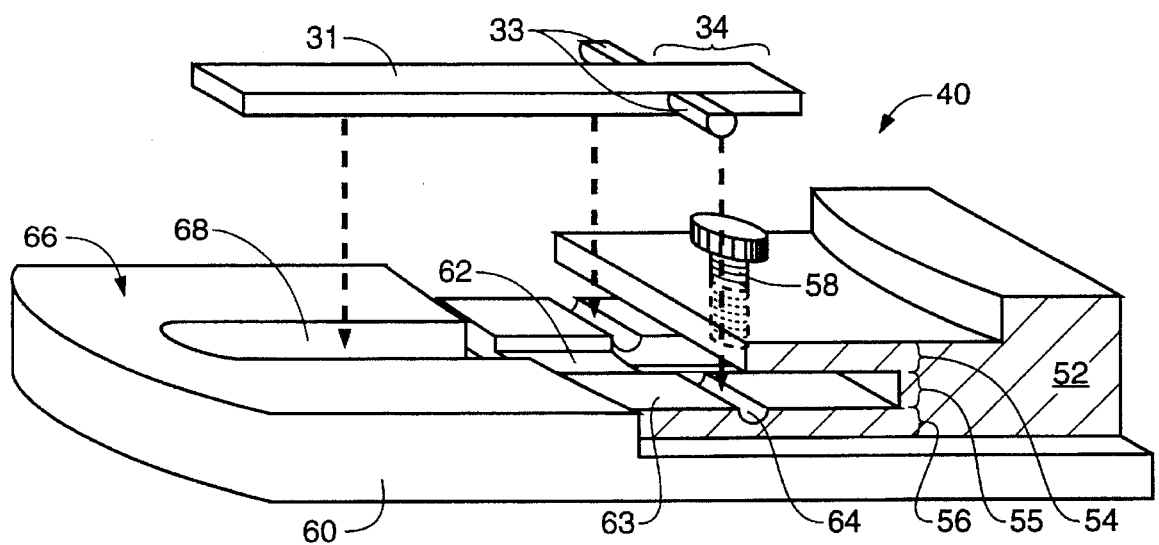
FIG. 5 is a detailed sectional illustration of a portion of one complete wafer plate arm assembly in relation to the heater and how the arm roughly fits into the assembly and is adjusted by the adjustment screw.

FIG. 5, is an isometric view of a single wafer arm assembly, comprising the following elements in addition to the previous figure elements: Back portion of a wafer support arm for placement against the adjustment screw 58. Block-like portions 54 and 56 form a cavity 55 in unitary plate 52. Heater 60 has top surface 66 and cavities 68 for receiving the wafer arms below the top surface 66.

Figure 6:
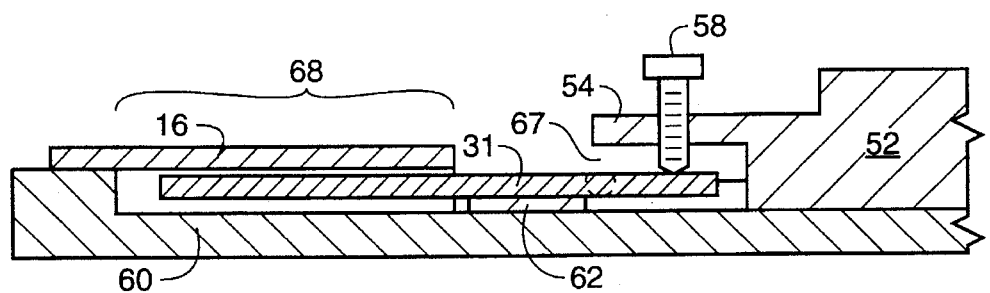
FIG. 6 is a sectional view of a thin slice down the central longitudinal line of FIG. 5.

FIG. 6, is a thin longitudinal slice of FIG. 5, having the following additional elements: cavity 67 allowing for vertical adjustment of the wafer arm holders.

REMARKS ABOUT THE INVENTION

One skilled in the art would easily understand how to operate the unitary device used for holding and rotating wafers during deposition of materials. Uniquely, a single wafer holder arms 31 can be mounted and removed from the unitary device quickly and easily without further dismantling of the unitary arm wafer holder 40. Additionally, it is easily understood that each arm can be calibrated for the alignment of the parallel pairs of arms for accurate balancing of the wafers during the PECVD processes.

With the increased ease of removing the arms 31, operators will be able to remove a single arm when becoming damaged. Furthermore, upon a complete cleaning of the PECVD device, all arms may easily be removed to greatly increase the prevention of damage to the expensive arms.

VARIATIONS IN THE INVENTION

There are several obvious variations to the broad invention and thus come within the scope of the present invention. Uniquely, this invention may work with any form of CVD process, and can easily be adapted to use the disclosed embodiment. Although, the attached pivot arms 33 are illustrated, there are many other ways to create a pivot point for the wafer arms 31. For example a review of any simple mechanics books under the topic of pivots could illustrate easily adaptable pivots.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. An assembly for rotating semiconductor wafers, said assembly comprising:

a rotating disk-shaped body having a plurality of cavities disposed therein;

a pivotal assembly corresponding to each of said cavities; and a wafer holding means comprising: at least one pair of parallel arms, each pair of arms for holding a wafer, said at least one pair of parallel arms being releasably mounted in adjacent cavities and individually removable therefrom, each of said at least one pair of parallel arms having a pivot bar.

2. The assembly according to claim 1, wherein each of said at least one pair of parallel arms is an elongate structure, a first end of said elongate structure being disposed in one said cavities.

3. The assembly according to claim 2, wherein a second end of said elongate structure has a flat surface for balancing the wafer thereon.

4. The assembly according to claim 3, wherein said pivot bar is attached to said elongate structure at substantially right angles, thereby forming a cross-like configuration.

5. The assembly according to claim 1, wherein said pivotal assembly comprises:

a block assembly having a depression therein, said pivot bar being disposed in said depression; and an adjustment screw being disposed in said block assembly, said adjustment screw contacting said first end of said elongate structure, said adjustment screw for leveling said elongate structure in one of said cavities.

6. The assembly according to claim 5, wherein said block assembly further comprises:

an overhang disposed over at least a portion of one of said cavities, said adjustment screw being disposed in said overhang.

7. An apparatus for holding semiconductor wafers, said apparatus comprising:

an elongate structure having a cross-like pivot bar attached thereto; and a block assembly having a cavity for releasably mounting said elongate structure and an adjustment device disposed superjacent said cavity.

8. The apparatus according to claim 7, wherein said adjustment device levels said elongate structure in said cavity.

9. The apparatus according to claim 8, wherein said block assembly has a depression in which to dispose said pivot bar, said depression substantially conforming to said pivot bar.

10. The apparatus according to claim 9, wherein said elongate structure has a flat surface.

11. The apparatus according to claim 10, wherein said adjustment device comprises a screw.

12. The apparatus according to claim 11, further comprising:

another elongate structure and another block assembly disposed parallel to said elongate structure and said block assembly, thereby forming a pair, said pair for holding a wafer.

13. The apparatus according to claim 12, further comprising a plurality of said pairs disposed in a turntable.

14. A device for securing semiconductor wafers, said device comprising:

a turntable having a plurality of cavities; and a plurality of elongate structures releasably mounted in said turntable, one of said elongate structures being mounted in each of said cavities, each of said elongate structures having a cross-like pivot bar.

15. The device according to claim 14, wherein said elongate structures are disposed in parallel in pairs, each of said pairs for holding a wafer.

16. The device according to claim 15, wherein each of said cavities has a depression for holding said pivot bar.

17. The device according to claim 16, wherein an overhang corresponds to each of said cavities, said overhang having a leveling device disposed therein.

18. The device according to claim 17, wherein said leveling device contacts said elongate structure when said elongate structure is disposed in said cavity such that said elongate structure is individually adjustable.

19. The device according to claim 18, wherein said leveling device being releasable such that said elongate structure is individually removable from said cavity.

20. The device according to claim 19, wherein said leveling device comprises a screw.

* * * * *